US010319212B2

(12) United States Patent
Gabay Villafaña et al.

(10) Patent No.: US 10,319,212 B2
(45) Date of Patent: Jun. 11, 2019

(54) ELECTRONIC DEVICE FOR DETECTING A MAGNETIC FIELD INDICATING THE GAS LEVEL IN STATIONARY TANK AND WIRELESS DATA SENDING

(71) Applicants: Pedro Gabay Villafaña, San Luis Potosi (MX); Jose Luis Rojas Calderon, San Luis Potosi (MX); Agustin Gabriel Rojas Calderon, San Luis Potosi (MX)

(72) Inventors: Pedro Gabay Villafaña, San Luis Potosi (MX); Jose Luis Rojas Calderon, San Luis Potosi (MX); Agustin Gabriel Rojas Calderon, San Luis Potosi (MX)

(73) Assignees: Pedro Gabay Villafaña, San Luis Potosi (MX); Jose Luis Rojas Calderon, San Luis Potosi (MX); Agustin Gabriel Rojas Calderon, San Luis Potosi (MX)

( * ) Notice: Subject to any disclaimer, the term of this patent is extended or adjusted under 35 U.S.C. 154(b) by 0 days.

(21) Appl. No.: 15/753,286

(22) PCT Filed: Jun. 9, 2016

(86) PCT No.: PCT/IB2016/053418
§ 371 (c)(1),
(2) Date: Feb. 17, 2018

(87) PCT Pub. No.: WO2017/029562
PCT Pub. Date: Feb. 23, 2017

(65) Prior Publication Data
US 2018/0197396 A1 Jul. 12, 2018

Related U.S. Application Data

(63) Continuation of application No. PCT/IB2016/053418, filed on Jun. 9, 2016.

(30) Foreign Application Priority Data

Aug. 17, 2015 (MX) .......................... A/2015/007429

(51) Int. Cl.
*G08B 21/18* (2006.01)
*G01R 33/00* (2006.01)
(Continued)

(52) U.S. Cl.
CPC ........... *G08B 21/182* (2013.01); *G01F 23/38* (2013.01); *G01R 33/00* (2013.01); *G01R 33/02* (2013.01); *G01R 33/06* (2013.01)

(58) Field of Classification Search
CPC ......... G01F 23/38; G01R 33/00; G01R 33/02; G01R 33/06; G08B 21/182
(Continued)

(56) References Cited
U.S. PATENT DOCUMENTS 5,023,806 A 6/1991 Patel
6,107,793 A 8/2000 Yokotani et al.
(Continued)

OTHER PUBLICATIONS

International Search Report and Written Opinion for PCT Patent App. No. PCT/IB2016/053418 (dated Dec. 9, 2016).

*Primary Examiner* — Joseph H Feild
*Assistant Examiner* — Sharmin Akhter
(74) *Attorney, Agent, or Firm* — Kenealy Vaidya LLP (57) ABSTRACT

Some embodiments are directed to a novel electronic device which detects the load level of gas in liquid state contained in tanks, through the magnetic field generated by the magnets used in floater mechanical systems which are incorporated into the containers, sending information by a remote interface, which communicates via the internet, or through a local network, to any computer or smart device. The versatility of the disclosed device, allows it to be adapted into any type of tank which uses the floating mechanical system with (Continued)

a magnet, being the ideal solution for monitoring gas consumption in places where access to the gas container is difficult or risky.

22 Claims, 12 Drawing Sheets

(51) Int. Cl.
 *G01R 33/02* (2006.01)
 *G01R 33/06* (2006.01)
 *G01F 23/38* (2006.01)

(58) Field of Classification Search
 USPC .......................................................... 340/618
 See application file for complete search history.

(56) References Cited

U.S. PATENT DOCUMENTS

| | | |
|---|---|---|
| 6,336,362 B1 | 1/2002 | Duenas |
| 6,490,922 B1 | 12/2002 | Sprea et al. |
| 2005/0120793 A1 | 6/2005 | Cochran et al. |
| 2007/0169549 A1 | 7/2007 | Kwun et al. |
| 2008/0150750 A1 | 6/2008 | Parris et al. |
| 2008/0236275 A1 | 10/2008 | Breed et al. |
| 2008/0254356 A1 | 10/2008 | Liersch et al. |
| 2009/0198384 A1 | 8/2009 | Ahn |
| 2012/0150344 A1 | 6/2012 | Jennings |
| 2012/0206271 A1 | 8/2012 | McSheffrey, Jr. |
| 2013/0146604 A1 | 6/2013 | Moreno et al. |
| 2013/0211623 A1 | 8/2013 | Thompson et al. |
| 2013/0211976 A1 | 8/2013 | Breed |
| 2013/0285836 A1 | 10/2013 | Proud |
| 2015/0330828 A1* | 11/2015 | Colvin, Jr. ............... G01F 23/38 702/55 |
| 2016/0377474 A1* | 12/2016 | Stillman ................ G01F 23/62 340/618 |

* cited by examiner

ELECTRONIC DEVICE FOR DETECTING A MAGNETIC FIELD INDICATING THE GAS LEVEL IN STATIONARY TANK AND WIRELESS DATA SENDING

CROSS REFERENCE TO RELATED APPLICATIONS

This application is a national phase filing under 35 C.F.R. § 371 of and claims priority to PCT Patent Application No. PCT/IB2016/053418, filed on Jun. 9, 2016, which claims the priority benefit under 35 U.S.C. § 119 of Mexican Patent Application No. MX/a/2015/007429, filed on Aug. 17, 2015, the contents of each of which are hereby incorporated in their entireties by reference.

BACKGROUND

Some embodiments relate to a novel electronic device which detects the load level of the gas in liquid state which is contained in tanks, by the magnetic field generated by the magnets used in mechanical systems of the floater incorporated within the containers, sending the information by a remote interface, which communicates via the internet, or through a local network, with any computer or smart device.

To check on the load level of the gas in liquid state within the containers, they must be constantly monitored visually, in order to recognize changes in the load level within the container itself.

Currently, in order to determine the load level in gas containers, as is the case in stationary LP gas tanks, an analog reader is employed, which is placed on the outer surface of the tank, which, is based on a mechanical component, composed of a floater which is placed in the inner part of the tank. Both, the gas level reader, as well as the supply valve of the container, are usually placed on the upper part of the tank, which is completely sealed in order to avoid leaks.

The mechanical system for measuring the gas load level, consists of a floating part coupled to a rod with a gear, which itself, is coupled unto a second gear which causes a magnet to turn; the movement of the magnet, is proportional to the displacement of the floater caused by an increase or decrease in the level of the liquid within the inner part of the container.

The position of the magnet therefore reflects a measurement, which is translated into the corresponding percentage to the actual gas level contained in a liquid form within the tank.

According to the safety requirements, the floater mechanical device, the gear and the magnet are found completely incorporated within the inner part of the tank, causing that any error in the functioning of the mechanical system be contained within the tank, which prevents creating a gas leak.

The position of the magnet of the mechanical device is used for obtaining a numerical value used in various interpretation systems. Such systems allow the user to know the load level of the container reported by the mechanical system and thus, the percentage of gas within the container itself.

Various known mechanisms exist for the interpretation of the position of the magnet, which itself reflects the position of the floater.

The simplest and most basic manner for interpreting the position of the inner magnet is by using a second outer magnet, coupled by a magnetic field to the inner magnet.

The outer magnet is found within the inner part of a plastic dial cover, which typically is in a numbered disc shape; the outer magnet, is itself coupled to an indicating needle, which is placed at the center of the numbered disc for indicating the load level of the tank.

The magnetic field of the inner tank causes the lines of the magnetic field of the outer magnet, to become aligned with it, causing the positions of both magnets to coincide. The outer magnet, by a small hand, graphically indicates the percentage level of the gas in a liquid state contained within the stationary tank.

Other ways of obtaining the reading of the load level of the containers of gas in liquid state which are known in the field, send the reading obtained by the analog reader through a cable towards a remote screen, on which the percentage level of the gas in liquid state contained within the tank is shown numerically.

The device, object of present invention, employing the communication protocols incorporated within the so called smart devices which currently exist, such as is the case with mobile cell phones, PDAs and others, is capable of sending in a wireless manner, the reading information obtained from the analog meter to either fixed devices and/or mobile devices, using the Internet, or yet, creating a local network through Bluetooth, WiFi, etc.

The current smart devices may connect themselves to networks or communicate amongst each other, through various known communication protocols known in the art, such as is the case with Bluetooth, WiFi, etc, which allow the synchronizing of systems at long distance and the exchange of information in real time.

Current mobile devices allow the synchronization with personal computers, to update applications and exchange data through the internet, which it itself, allows managing of files and the ability to control the devices remotely.

The electronic device for detecting the magnetic field which indicates the level of gas in stationary tanks and the sending of data in a wireless manner of present invention, is easily coupled over, or next to, the analog reader of the tank which uses the floater mechanical systems for measuring its load level.

The electronic sensor of the device of present invention, is capable of measuring the magnetic field produced by the inner magnet of the analog reader of any tank that uses floater mechanical systems, sending the obtained information, by a remote interface, which is capable of communicating with any computer or smart device, through the internet, or yet, through a local network created for such purposes.

A new method is described for the reading of the level of gas in liquid form contained in tanks, by an electronic device which interacts through a remote interface and which communicates through the internet with any computer or smart device.

A magnetic field electronic sensor which is capable of measuring the direction of the magnetic field produced by the inner magnet found in the inner part of a container; the sensor is found in an electronic card, which additionally includes a microprocessor and a telecommunication antenna for implementing a wireless communication protocol.

The electronic card sends information gathered by the sensor to a mobile device, in the mobile device, through an application, are displayed the levels of gas in a liquid state which are contained within a stationary tank.

The electronic card is made up of the following features:
An electronic magnetic field sensor, which is capable of reading the magnetic field and which is placed near the magnet which is found within the inner part of the tank. The sensor is capable of measuring the magnetic field in three dimensions and, thus, provides information useful for undertaking corrections to the readings;

A microprocessor which is charged with interpreting the information gathered by the sensor. The microprocessor processes the information taking into account the readings in three dimensions for correcting errors caused by the position in which the sensor is placed. After having undertaken the corrections, the microprocessor converts the gathered information into an appropriate format, for later transmitting it wirelessly using an appropriate communication protocol;

A wireless transmission module, which receives the information which has been formatted by the microprocessor and sends it to a mobile device to be displayed.

The electronic card, together with the interface allows the display of the numeric value which represents the gas level in liquid state contained in the stationary tank.

The interface incorporates a wireless receptor, which allows for visualization in a remote manner without physical connecting cables, of the level of gas in liquid state contained within the tank.

The electronic device object of present invention is capable of undertaking periodical measurements of the gas level, as well as storing information in an inner memory.

The connection with the remote interface is undertaken automatically when this is found within the range of connection of the communication protocol, storing in the inner memory the information downloaded and received from remote interface.

Using an adequate telecommunication protocol, the interface is capable of sending the information obtained to a data base designed for this purpose, to store them and identify them, according to the place where they were generated, thereby allowing the identifying of different users.

Using the information provided by the electronic card and the location thereof, statistical information regarding the gas consumption habits of a user can be generated. The information may be consulted through remote interface.

The electronic card is powered by batteries, which provide the energy for the functioning of the sensor, microprocessor and telecommunication module. The batteries ensure the uninterrupted functioning of the device object of some embodiments.

Other objectives, advantages and features of some embodiments as described herein, will become apparent for persons of ordinary skill in the art upon reading the disclosure outlaid further.

DETAILED DESCRIPTION OF EXEMPLARY EMBODIMENTS

Figure 1:
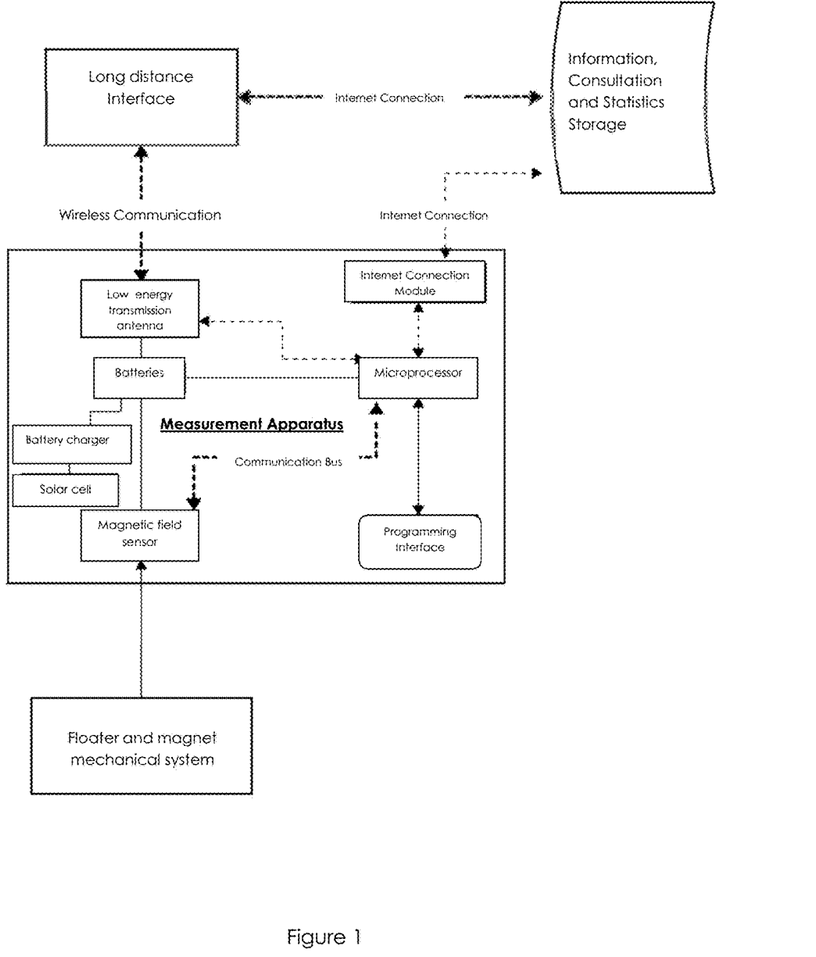
FIG. 1 shows a block diagram of the device object of some embodiments.

A specific advantageous or preferred materialization of some embodiments will now be described together with the accompanying figures, in which:

In FIG. 1 which shows a block diagram of the device object of some embodiments, wherein the functioning of the electronic device with remote interface is shown which is used to monitor the load level in tanks designed to contain gas.

The device object of some embodiments is powered by batteries, which are recharged by a battery charger connected to a solar cell, or through suitable device.

The magnetic field sensor communicates with the microprocessor of the device object of some embodiments, by the communication BUS; the microprocessor, in turn communicates with the programming interface.

The microprocessor, by the internet connection module, exchanges data with the information, consulting and statistics storage device.

The microprocessor, by the low energy transmission antennae, communicates with the interface at a distance, which itself, establishes communication via internet with the information, consulting and statistics storage device.

Figure 2:
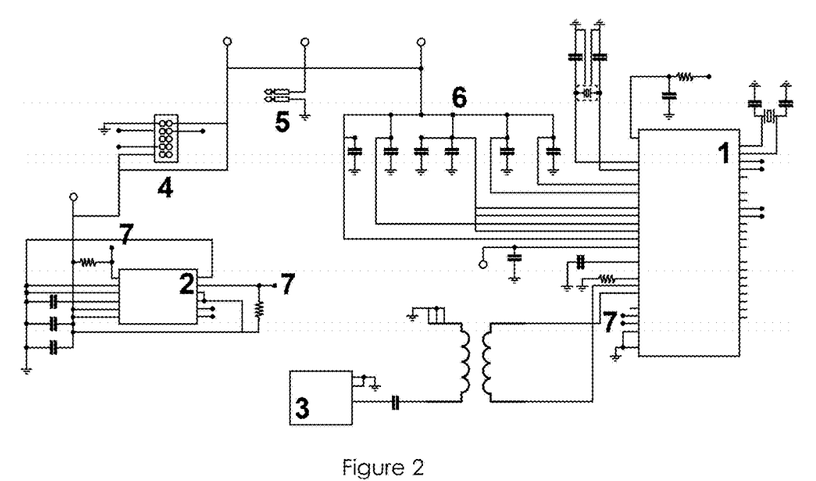
FIG. 2 shows a schematic diagram of the electronic card used in the device object of some embodiments.

In FIG. 2 which shows a schematic diagram of the electronic card used in the device object of some embodiments, wherein the microprocessor 1 is the element charged with processing the signals produced by the sensor 2 and converting them into a numerical value representing the percentage of gas in liquid state contained in the tank. The numerical values of the percentage of gas in liquid state contained in the tank are later sent to the telecommunication antennae 3.

The magnetic field sensor 2 is placed nearby the magnet (not shown in the Figure) which is found in the inner part of the tank and which generates signals which correspond to the intensity of the field in three dimensions. The signals are sent through a communication bus 7 to the microprocessor 1 for their processing.

The transmission antennae 3, transmits electromagnetic waves to send the information to the interface at a distance, which consists of a reception antennae of the mobile device, as could be the case of a PDA telephone or similar.

The programming interface of the microprocessor 4, is used for writing the code for the microprocessor 1, which interprets the signals from the sensor of the magnetic field 2 as well as its sending to the telecommunication module.

The supply batteries 5 provide the energy for the functioning of the device object of some embodiments.

The system of conditioning and signal filtering circuit 6 is used for decreasing the noise in the signals produced by the magnetic field sensor 2.

The communication BUS 7 is the communication channel for the sending of signals from the magnetic field sensor 2, towards the microprocessor 1.

The supply batteries 5 are rechargeable for extending the time between battery changes. The rechargeable batteries 5 are recharged through a supply circuit which gathers energy from the sun using photovoltaic cells (not shown in the figures).

The communication protocol implements a wireless transmission protocol capable of covering a radius with sufficient reach to be able to transmit the data to the remote interface when the latter is found in the same building where the device object of some embodiments has been placed.

Additionally, the communication protocol consists of a telecommunication technology capable of sending the data to the information, consultation, and statistics storage server using an internet connection, in such a way that it allows consulting the sensor readings from a distance, using the interface with an internet connection.

The electronic card described in FIG. 2, contains all the components which are necessary for the functioning of the device object of some embodiments, which, may be designed in the appropriate size and shape, to be inserted into a housing, which itself will have the ideal shape which will allow it to be easily incorporated into any type of gas storage tank.

The material for the housing which shall contain the electronic card of the device object of present invention may be made from plastic or made from any suitable non-magnetic material, which avoids interference and noise in the readings of the magnetic sensor.

The housing of the device may be designed in any suitable shape, in such a manner that it allows containing, both the electronic card, as well as the supply batteries, to be able to protect them from inclement weather, as could be the case with rain, wind, solar rays, as well as any other phenomena which could potentially damage the electronic circuit.

The housing includes the appropriate fastening elements, in such a way that it is able to adhere, in an advantageous or preferred materialization of some embodiments, over the plastic dial cover of the analog gas tank reader and in another advantageous or preferred materialization of some embodiments, on a side of the plastic dial cover of the analog reader, in such a way, that the incorporation of the device object of some embodiments, in either of both of the advantageous or preferred materializations, would not impede the reading of the analog gas tank reader and without its incorporation interfere, modify or distort, the values of the analog reader.

In another embodiment of some embodiments, the analog gas tank readers are eliminated.

Figure 3:
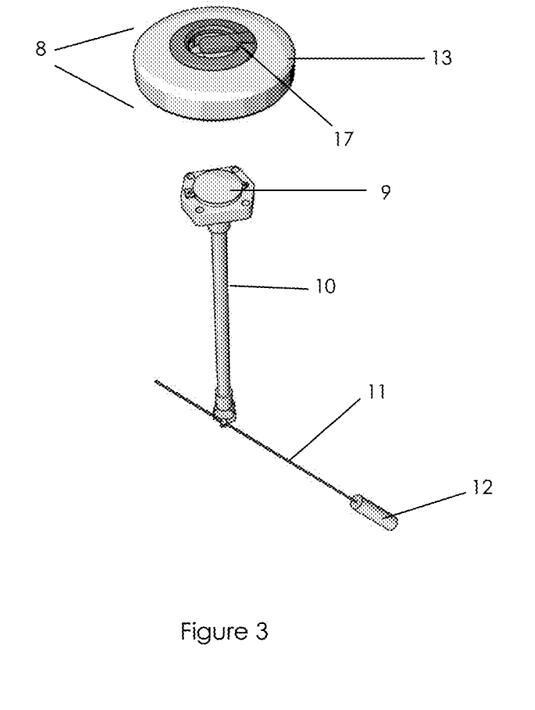
FIG. 3 shows a perspective view from the upper part of the device object of some embodiments.

FIG. 3 shows a perspective view from the upper part of an advantageous or preferred materialization of the device object of an embodiment 8, wherein the housing 13 is designed in a circular shape, to be placed over the plastic dial cover of the analog gas tank reader.

The housing 17 houses the electronic card described in FIG. 2, which is also in a circular shape with an opening which allows reading the dial cover of the analog 9.

The rod 10 is the mechanical axis over which the mechanical floating system 11 is attached to, in whose lower end, the floater 12 is found.

Figure 4:
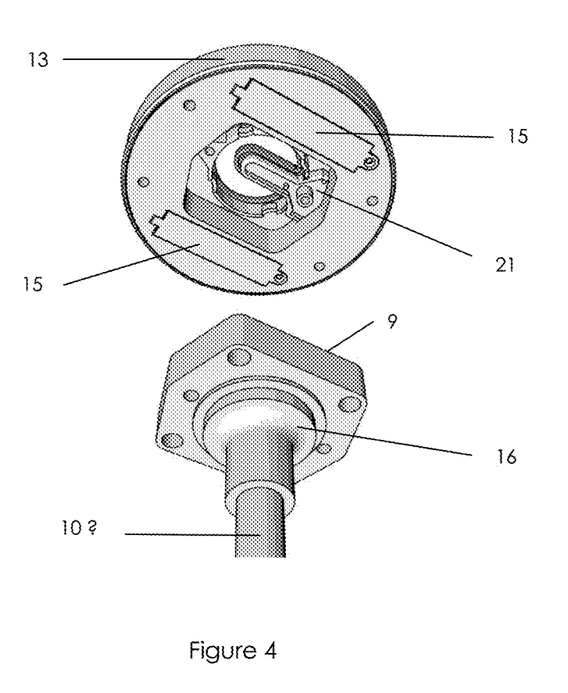
FIG. 4 shows a perspective view from the lower part of the device object of some embodiments.

FIG. 4 shows a perspective view from the lower end of the device object of some embodiments, wherein the orifice at the center of the housing 13 can be seen which has been molded with the same outline than that of the analog reader 9, in such a manner that it can become adapted to it.

On the base of the device object of some embodiments, the cover 15 of the batteries 5 can be seen along with the receptacle 21 of the card described in FIG. 2.

The rod 10 is attached to the base 16 which contains the inner magnet (not shown) over which the analog reader 9 is placed.

Figure 5:
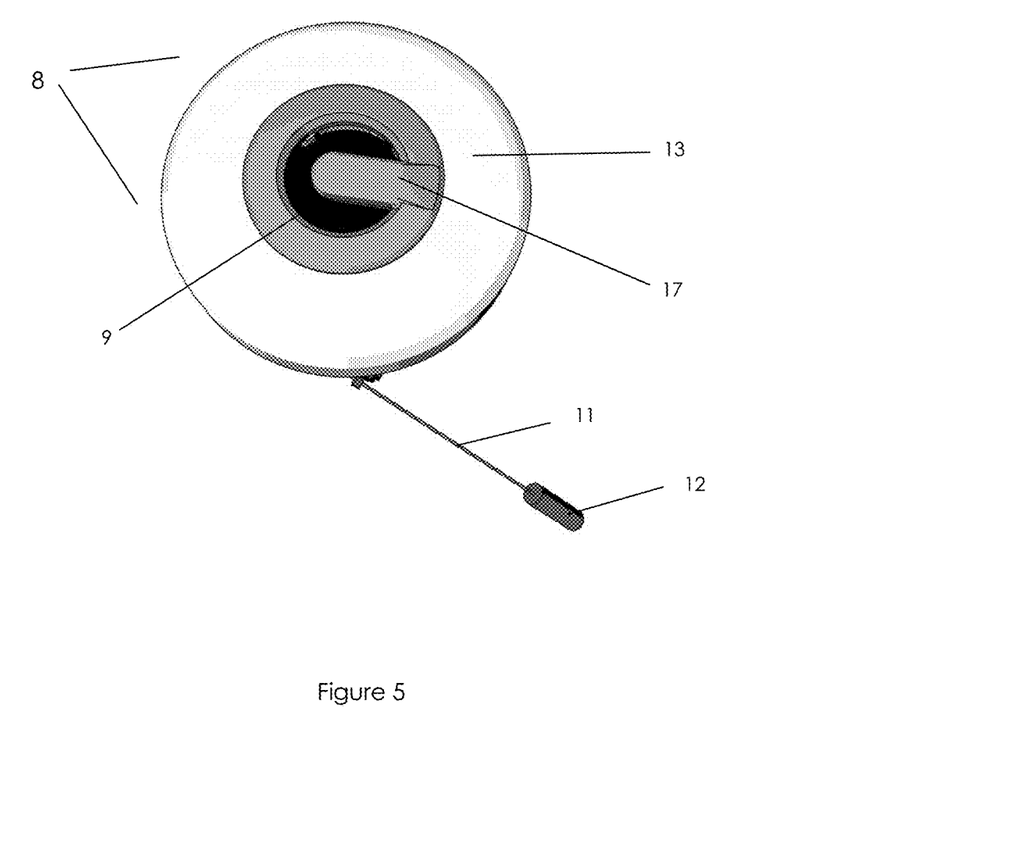
FIG. 5 shows an upper plane view of the device object of some embodiments.

FIG. 5 shows an upper plane view of the device object of an embodiment 8, wherein it can be seen that the housing 13 has a circular opening in which a second housing 17 which houses the electronic card described in FIG. 2, which also has a circular shape with an opening which allows reading the dial cover of the analog reader 9.

Figure 6:
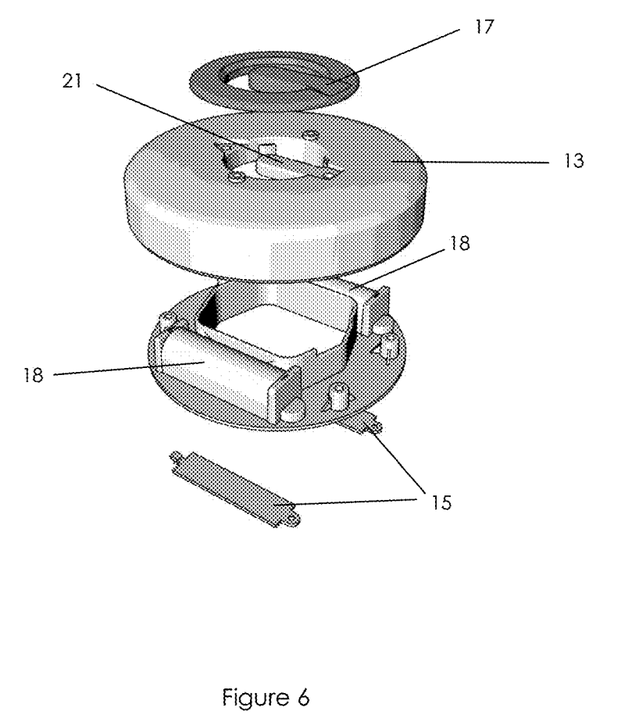
FIG. 6 shows a perspective view from the upper part in explosion of the device object of some embodiments.

FIG. 6 shows a perspective view from the upper part in explosion of the device object of some embodiments, wherein the housing 13 can be seen over which the second housing 17 is placed which houses the electronic card described in FIG. 2, which itself is placed in the receptacle 21 of the electronic card (not shown).

The batteries housings 18 (not shown) are placed on the base 26 of the housing, which are closed when the batteries are placed in their position with the battery covers 15 in order to close the electronic circuit.

Figure 7:
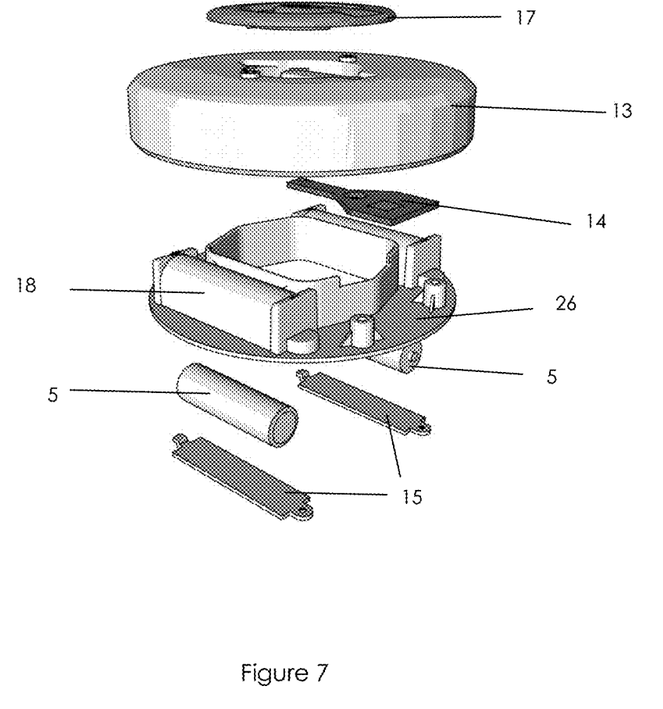
FIG. 7 shows a perspective view from the upper part in explosion with greater detail of the device object of some embodiments.

FIG. 7 shows a perspective view from the upper part in explosion with greater detail of the device object of some embodiments.

Figure 8:
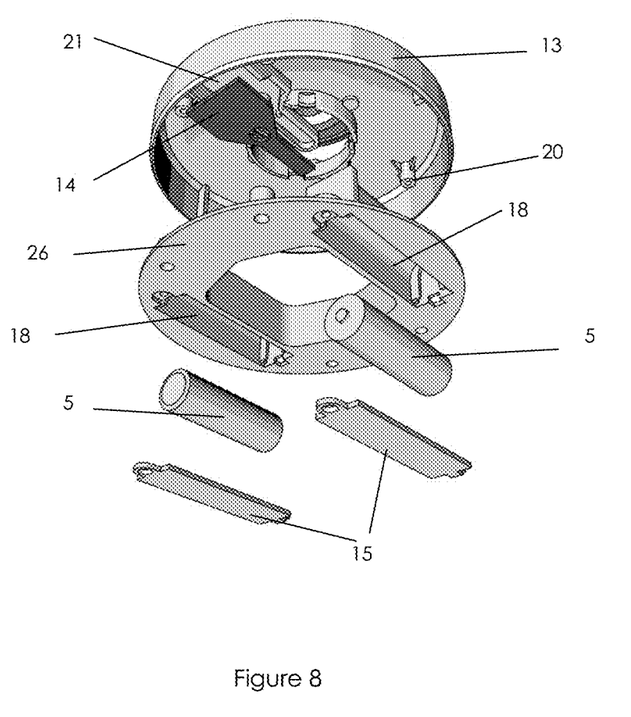
FIG. 8 shows a perspective view from the lower part in explosion of the device object of some embodiments.

FIG. 8 shows a perspective view from the lower part in explosion of the device object of some embodiments, the design of the interior of the housing includes the receptacle 21 whose outline has been designed to house the card 14.

The base of the housing 26 has been molded to house the batteries 5 within the receptacles 18, which have been closed with the covers 15.

Figure 9:
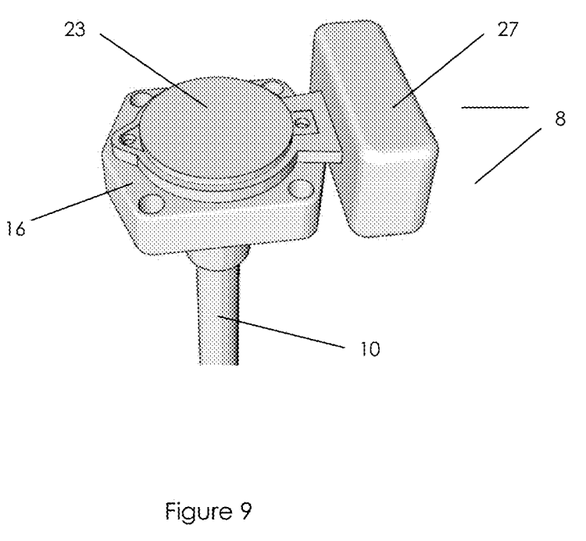
FIG. 9 shows the upper perspective view of another embodiment of the device object of some embodiments.
Figure 10:
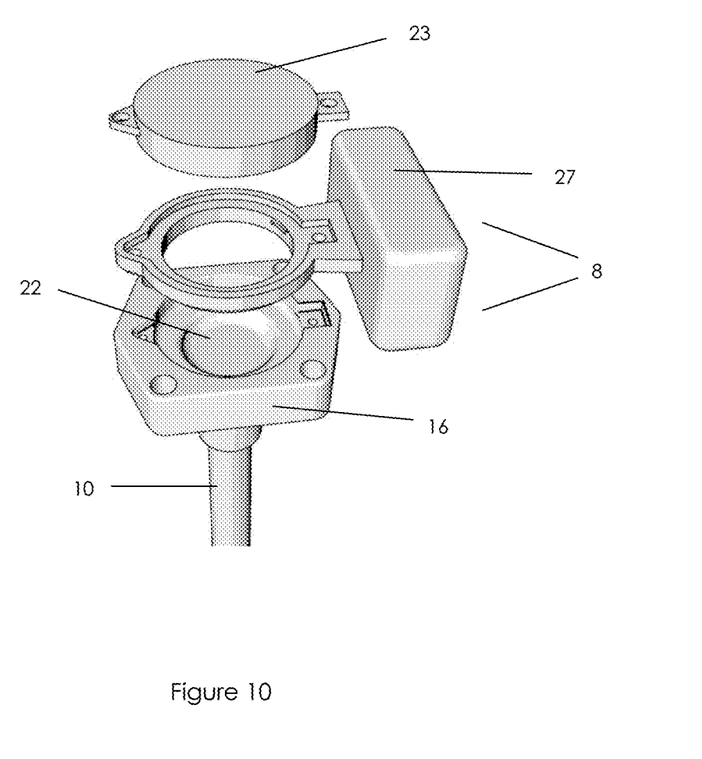
FIG. 10 shows the upper perspective view and in explosion of another embodiment of the device object of some embodiments.

FIGS. 9 and 10 show an upper view of another advantageous or preferred embodiment of the device 8 object of some embodiments, wherein the design of the housing 27 has a rectangular shape, which itself is placed on a side of the plastic dial cover of the analog reader 9 which is placed over the inner magnet (not shown) contained within the base 16, which itself is connected to the rod 10; the lid 23 covers the analog reader 9.

Figure 11:
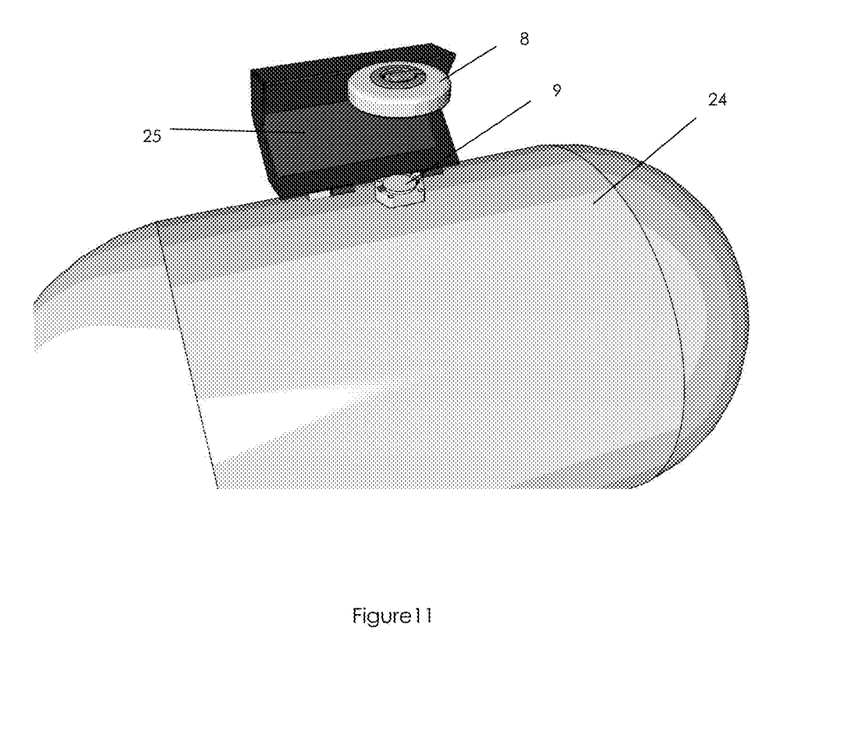
FIG. 11 shows a perspective view in explosion of the device object of some embodiments placed in a stationary gas tank.
Figure 12:
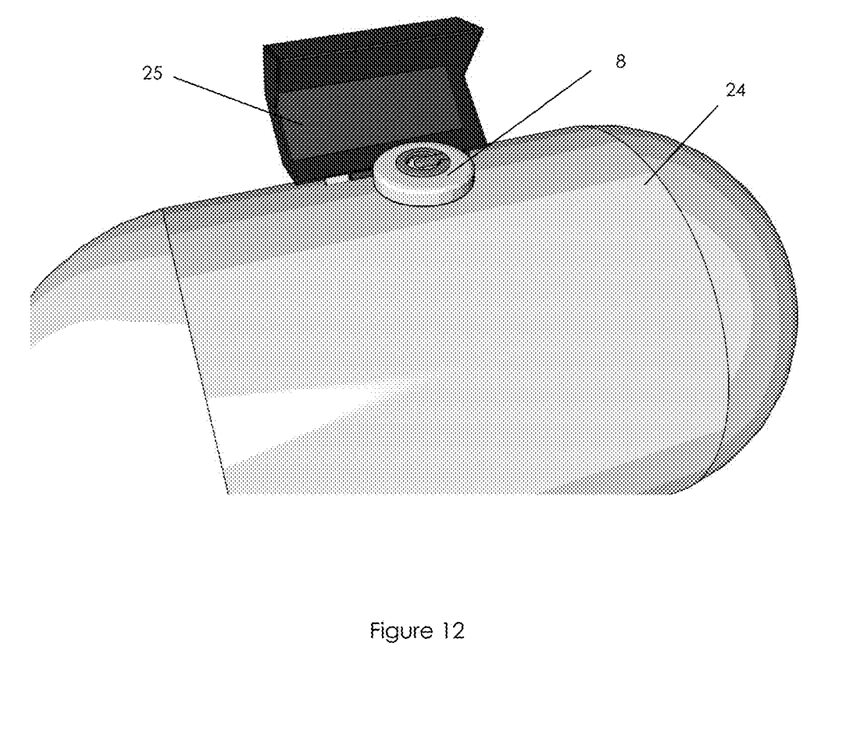
FIG. 12 shows a perspective view of the device object of some embodiments placed in a stationary gas tank.

FIGS. 11 and 12 show a perspective view in explosion of the device object 8 of some embodiments placed in a stationary gas tank, wherein the device 8 is placed over the plastic cover lid of the analog gas tank reader 9, which is found with a cover lid 25 which covers both the device of an embodiment 8 as well as the intake of the gas supply of the tank (not shown in the Figure).

Such as can be seen in the previously described figures, the electronic device apparatus for the detection of magnetic field which indicates the gas level in stationary tanks and the sending of data in a wireless manner of some embodiments, may be used in any tank designed for containing gas for household, commercial and industrial purposes.

The versatility of the device object of some embodiments, allows it to be placed in any type of tank which uses the mechanical system of a floater with a magnet, thereby converting itself into the ideal solution for monitoring gas consumption in places where physical access to the tank is difficult.

Given its wireless system for the sending of data, the device object of some embodiments, considerably lowers the accident risks existing for persons who need to consult the gas level in stationary tanks, when these are placed on the roofs of buildings.

Given that several modifications may be made to our invention as described herein, and that there are many apparent materializations of the same, which can be made within the spirit and scope of the claims without departing of the spirit and scope, we seek that all matter contained in the attached specifications should be interpreted merely in an illustrative manner and not in a limitative one.

The invention claimed is:

1. An electronic device for the detection of a gas level contained in a tank, the electronic device comprising:
 a magnetic field electronic sensor for measuring an at least two dimensional direction of a magnetic field produced by a magnetic element found in an inner part of the tank, the electronic sensor capable of correcting errors caused by the position of the magnetic field;
 a memory wherein measurements measured by the sensor are stored;
 a microprocessor which converts the measurements stored in the memory into a numerical value;
 a wireless transmission module which receives the numerical value and transmits a signal with the numerical value to
 a remote interface for remote monitoring of the gas level in the tank and controlling the electronic device; and
 at least one battery for the autonomous functioning of the electronic device.

2. The electronic device according to claim 1, wherein the remote monitoring of the gas level in the tank is undertaken by means of a mobile device using the remote interface which displays the levels of gas in liquid state contained within the tank.

3. The electronic device according to claim 1, wherein the remote interface allows remote and wireless visualization of the level of gas in liquid state contained in the tank.

4. The electronic device according to claim 1, wherein the remote interface comprises a mobile application.

5. The electronic device according to claim 1, wherein the connection with the remote interface is automatic when it is found within the connection range of a communication protocol.

6. The electronic device according to claim 1, wherein the remote interface stores the numerical value sent in a database as data.

7. The electronic device according to claim 6, wherein the database stores and classifies the data according to the place where they were generated, identifying different users and the consumer habits of these users.

8. The electronic device according to claim 7, wherein the consulting of data is undertaken in real time.

9. The electronic device according to claim 1, wherein the at least one battery is a bank of batteries comprising at least two rechargeable batteries which are recharged by means of solar panels or by any other means of recharging batteries.

10. The electronic device according to claim 1, wherein the electronic device is externally coupled over a dial cover of the tank, wherein the electronic device is not connected to the supply line and is not in contact with the gas.

11. The electronic device according to claim 1, wherein the wireless transmission module comprises a low energy transmission antenna.

12. A housing for an electronic device for the detection of gas level contained in tanks, the housing comprising:
 a body having a lower surface, an upper surface and at least one side wall;
 a first cavity located on the lower surface;
 at least one battery housing for housing at least one battery located proximate to the first cavity;
 a second cavity located on the upper surface, wherein a receptacle for the electronic device is located, over the receptacle a second housing is set which covers the device;
 wherein the first and second cavities are aligned and in direct communication;
 wherein the first cavity is coupled over a dial cover of a gas tank.

13. The housing of the electronic device according to claim 12, which is fastened with an analog reader set on the tank.

14. The housing of the electronic device according to claim 12, wherein the first cavity presents a shape which coincides with an analog reader set on the tank.

15. The housing of the electronic device according to claim 12, wherein the first cavity presents a circumferential wall which extends upwardly.

16. The housing of the electronic device according to claim 15, wherein the circumferential wall presents an opening for positioning the receptacle of the electronic device.

17. The housing of the electronic device according to claim 12, wherein the at least one batteries housing comprises two diametrically opposed housings.

18. The housing of the electronic device according to claim 17, wherein between the two housings the first cavity is found.

19. The housing of the electronic device according to claim 17, wherein the housings are set with covers.

20. The housing of the electronic device according to claim 12, wherein the receptacle of the electronic device is found above the first cavity.

21. The housing of the electronic device according to claim 12, wherein the second housing is fastened to the upper surface of the body.

22. A system for controlling a gas level in liquid state contained in a tank, the system comprising:
 a remote interface for remote monitoring of the gas level in the tank and controlling the electronic device;
 an electronic device for the detection of a gas level contained in the tank, the electronic device comprising:
 a magnetic field electronic sensor for measuring an at least two dimensional direction of a magnetic field produced by a magnetic element found in an inner part of the tank, the electronic sensor capable of correcting errors caused by the position of the magnetic field;
 a memory wherein measurements measured by the sensor are stored;
 a microprocessor which converts the measurements stored in the memory into a numerical value;
 a wireless transmission module which receives the numerical value and transmits a signal with the numerical value to the remote interface for remote monitoring of the gas level in the tank and controlling the electronic device; and
 at least one battery for the autonomous functioning of the electronic device; and
 a housing comprising:
 a body which presents a lower surface, an upper surface and a circumferential wall;
 a first cavity set on the lower surface;
 at least one battery housing for a bank of batteries set on a side of the first cavity;
 a second cavity set on the upper surface, wherein a receptacle for the electronic device is located, over the receptacle a second housing is set which covers the device;

the first and second cavities are found in alignment and in direct communication;
wherein the first cavity is coupled over a dial cover of a conventional gas tank.

* * * * *